United States Patent [19]
Kawamoto et al.

[11] Patent Number: 5,426,290
[45] Date of Patent: Jun. 20, 1995

[54] COLOR LINEAR IMAGE SENSING DEVICE

[75] Inventors: Seiichi Kawamoto; Tadakuni Narabu, both of Kanagawa, Japan

[73] Assignee: Sony Corporation, Tokyo, Japan

[21] Appl. No.: 111,009

[22] Filed: Aug. 24, 1993

[30] Foreign Application Priority Data

Aug. 24, 1992 [JP] Japan .................................. 4-248716

[51] Int. Cl.$^6$ ............................................. H01J 40/14
[52] U.S. Cl. ................... 250/208.1; 250/226; 257/440; 257/443
[58] Field of Search ............... 250/208.1, 226; 257/72, 257/222, 231, 440, 443, 432; 348/282; 358/512, 514, 533

[56] References Cited

U.S. PATENT DOCUMENTS 4,839,719 6/1989 Hirota et al. ..................... 358/514

FOREIGN PATENT DOCUMENTS 0223532 9/1988 Japan ..................................... 250/226

*Primary Examiner*—William L. Sikes
*Assistant Examiner*—James A. Dudek
*Attorney, Agent, or Firm*—Hill, Steadman & Simpson

[57] ABSTRACT

A color linear image sensing device for scanning and sensing an image in a vertical scanning direction and generating signal charges corresponding to the image. The device comprises at least two arrays of a plurality of sets of color sensors disposed in a horizontal scanning direction. The sensor arrays sense the image and generate the signal charges corresponding to the image. Each set of color sensors includes a first color sensor sensing a first color and a second color sensor sensing a second color different from the first color. The color sensors are arranged such that both of the first and the second color sensors are located on any line in the vertical scanning direction.

9 Claims, 2 Drawing Sheets

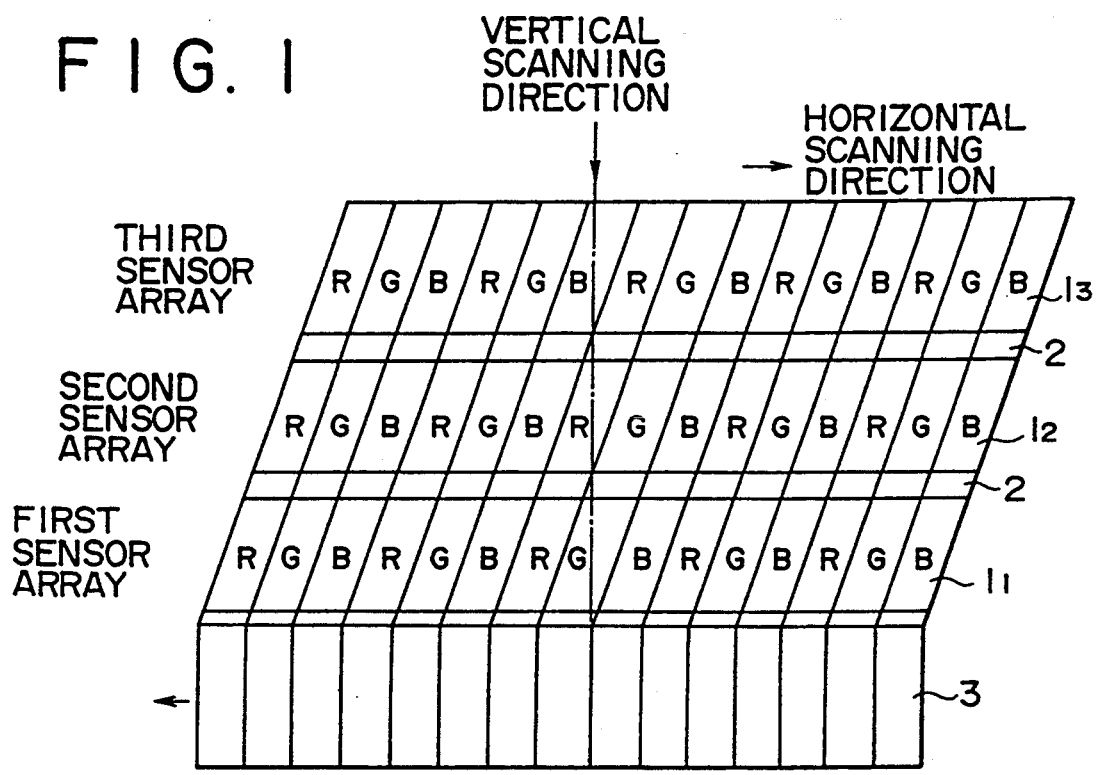
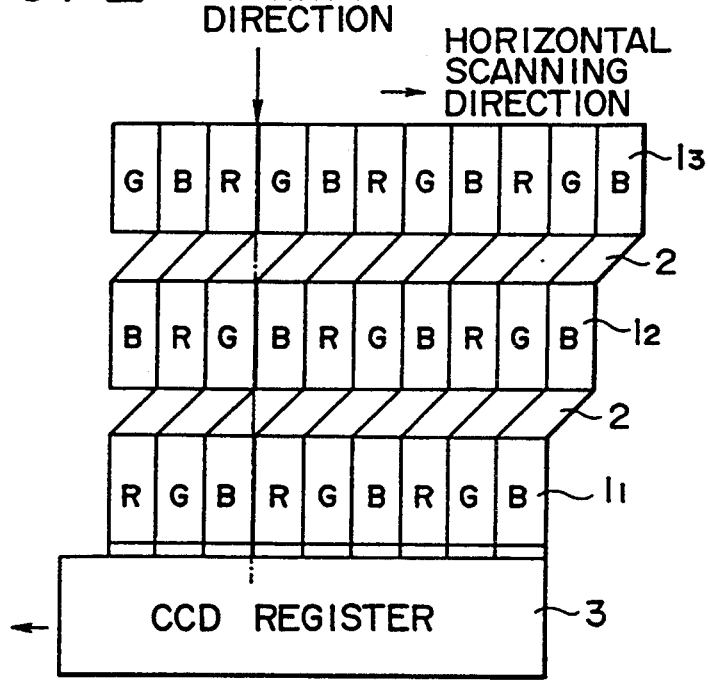

COLOR LINEAR IMAGE SENSING DEVICE

BACKGROUND OF THE INVENTION

1. Field of the Invention

The present invention relates to a color linear image sensing device and, more particularly, to a synchronous addition type color linear image sensing device comprising N (positive integer) arrays of sensors arranged in a vertical scanning direction, each sensor array including a plurality of sets of color filters disposed in a horizontal scanning direction, each color filter set being made of the same combination of color filters.

2. Description of the Related Art

One representative type of linear sensor is the so-called synchronous addition type linear sensor. This type of sensor has N (positive integer) arrays of sensors disposed in a vertical scanning direction, each array comprising numerous picture elements. A shift gate is furnished between sensor arrays. When an N-th sensor array reads a single line of text, the signal charges corresponding to that line are shifted to the (N-1)th sensor array through the sensor gate. At the same time, a drive system is activated to have the (N-1)th sensor array read the same single line of text. The operations are repeated until the added signal charges are transferred to a shift register provided independently of the N sensor arrays. The signal charges are then transferred from the shift register in the horizontal scanning direction (disclosed in Japanese Patent Laid-Open No. HEI/4-56461).

According to the synchronous addition type linear sensor as outlined above, each line of text is read by each of the sensor arrays and added up successively. This means that the sensitivity available with this sensor is N times as high as that of the sensor with no synchronous addition capability. The enhanced sensitivity is a major advantage of the synchronous addition type linear sensor.

What the inventors have devised now is a color linear image sensing device as an application of the synchronous addition type linear sensor. FIG. 4 is a plan view of a related art synchronous addition type color linear sensor developed by the inventors, indicating its major disadvantageous aspect. In FIG. 4, R stands for a red filter, G for a green filter and B for a blue filter. In each sensor array, the unit set of R, G and B occurs repeatedly in the horizontal scanning direction.

With the related art synchronous addition type color linear sensor of FIG. 4, the same points of an object are always scanned by the same color filters. This is because each of the sensor arrays comprises the same sets of color filters with no staggers of filter positions provided therebetween. In other words, there exist no discrepancies between the direction in which the signal charges are transferred and the direction in which the light spot advances for vertical scanning.

Given the above constitution, the related art synchronous addition type color linear sensor of FIG. 4 has a major disadvantage: it tends to develop a moire pattern. Suppose that a small image such as is encircled in FIG. 4 occurs in the red (R) and green (G) filter positions, as illustrated. In such a case, when scanned vertically, the image always occurs in the R and G filter positions. It follows that the blue component of the image is never detected while the signal charges corresponding to the image are being transferred to the shift register. This leads to the appearance of a spurious color pattern, i.e., moire.

SUMMARY OF THE INVENTION

It is therefore an object of the present invention to overcome the above and other deficiencies and disadvantages of the related art and to provide a color linear image sensing device that improves on the related art.

In carrying out the invention and according to one aspect thereof, there is provided a color linear image sensing device for scanning and sensing an image in a vertical scanning direction and generating signal charges corresponding to the image, the device comprising: at least two arrays of a plurality of sets of color sensors disposed in a horizontal scanning direction, for sensing the image and generating the signal charges corresponding to the image, each of the sets comprising a first color sensor sensing a first color and a second color sensor sensing a second color different from the first color; wherein the color sensors are arranged such that both of the first and the second color sensors are located on any line in the vertical scanning direction.

According to another aspect of the invention, there is provided a color linear image sensing device for scanning and sensing an image in a vertical scanning direction and generating signal charges corresponding to the image, the device comprising: at least two arrays of a plurality of sets of color sensors disposed in a horizontal scanning direction, for sensing the image and generating the signal charges corresponding to the image, each of the sets comprising a first color sensor sensing a first color and a second color sensor sensing a second color different from the first color; and a shift register formed adjacent to the arrays for transferring the signal charges; wherein the color sensors are arranged such that both of the first and the second color sensors are located on any line in the vertical scanning direction.

According to a further aspect of the invention, there is provided a color linear image sensing device for scanning and sensing an image in a vertical scanning direction and generating signal charges corresponding to the image, the device comprising: three arrays of a plurality of sets of color sensors disposed in a horizontal scanning direction perpendicular to the vertical scanning direction, for sensing the image and generating the signal charges corresponding to the image, each of the sets comprising a first color sensor sensing a first color, a second color sensor sensing a second color different from the first color, and a third color sensor sensing a third color different from the first and the second colors; and a shift register formed adjacent to the arrays for transferring the signal charges; wherein the color sensors are arranged such that the first, the second and the third color sensors are located on any line in the vertical scanning direction.

In the color linear image sensing device of the present invention structured as described above, a single picture element is scanned by a plurality of sensor arrays in the vertical direction in such a manner that that picture element is scanned by all color sensors constituting one complete set of color sensors. This means that all color components of each picture element are read unfailingly into the sensing device, whereby the generation of any moire pattern is prevented. Preferably, the color linear image sensing device further includes shift gates between the sensor arrays so that the signal charges are transferred smoothly from the shift gates to the sensor arrays and/or vice versa.

These and other objects, features and advantages of the invention will become more apparent upon a reading of the following description and appended drawings.

BRIEF DESCRIPTION OF THE DRAWINGS

FIG. 1 is a plan view of a color linear image sensing device practiced as a first embodiment of the invention;

FIG. 2 is a plan view of a color linear image sensing device practiced as a second embodiment of the invention;

DESCRIPTION OF THE PREFERRED EMBODIMENTS

Figure 3:
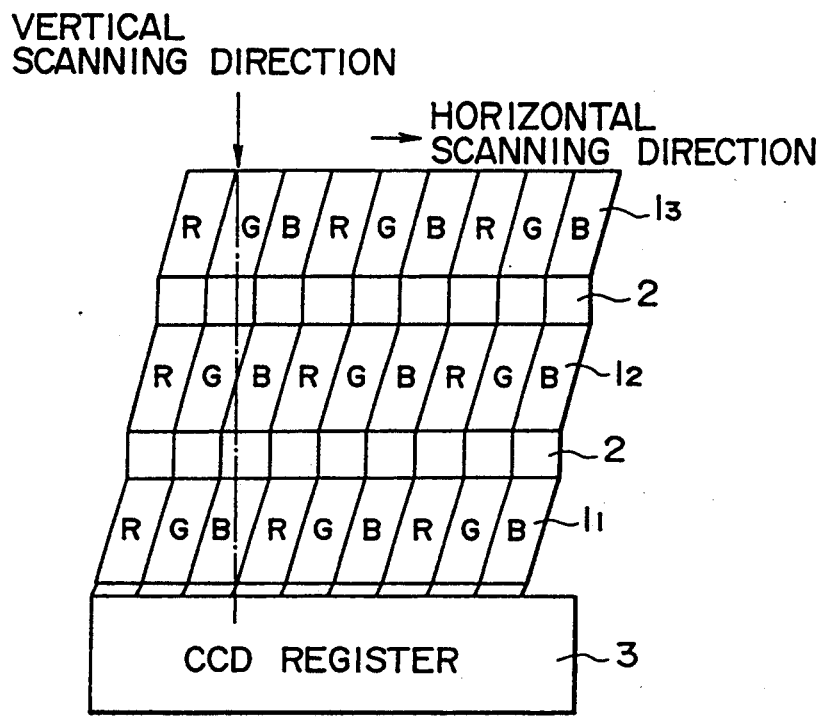
FIG. 3 is a plan view of a color linear image sensing device practiced as a third embodiment of the invention.
Figure 4:
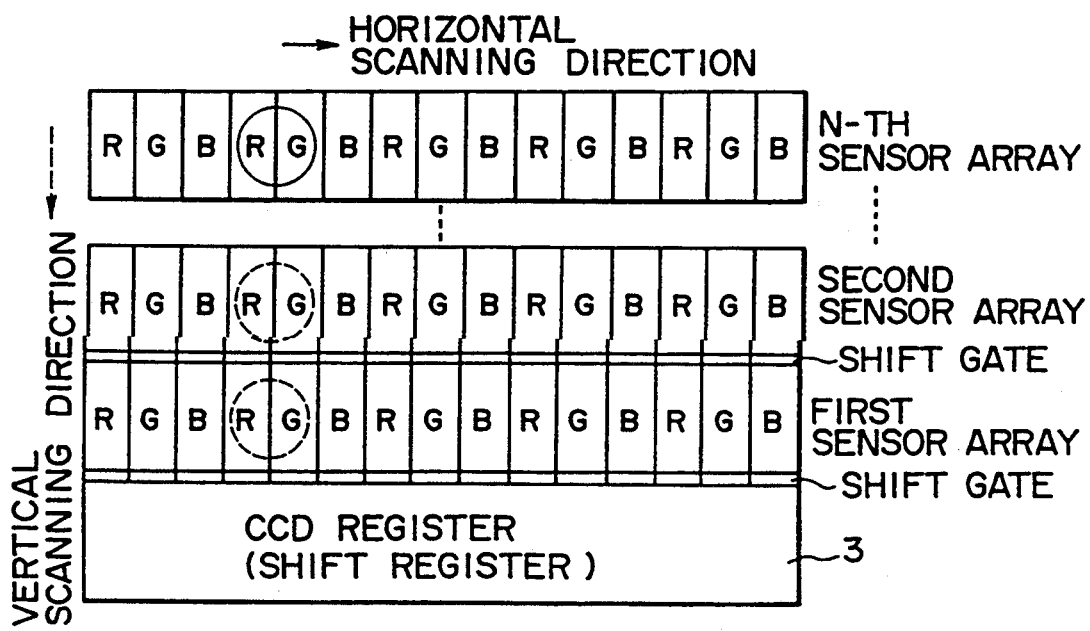
FIG. 4 is a plan view of a related art synchronous addition type color linear sensor indicating its major disadvantageous aspect.

The preferred embodiments of the invention will now be described with reference to the accompanying drawings.

FIG. 1 is a plan view of a color linear image sensing device practiced as the first embodiment of the invention. The first embodiment is a synchronous addition type color linear image sensing device having three arrays of sensors. In FIG. 1, reference numeral $1_1$ is a first sensor array; $1_2$ is a second sensor array; $1_3$ is a third sensor array; 2 is a shift gate furnished between sensor arrays; and 3 is a shift register. Reference characters R, G and B denote a red filter, a green filter and a blue filter, respectively, furnished in the picture element (sensor) positions of the sensor arrays $1_1$ through $1_3$. The three filters (R, G, B) constitute a color filter set.

In the first embodiment, the sensors of the color filter arrays $1_1$, $1_2$ and $1_3$ as well as the shift gates 2 between the color filter arrays are formed obliquely relative to the vertical direction. The color sensor arrays are staggered so that across the first to the third color filter arrays $1_1$ through $1_3$, the same picture element is scanned by the sensors of all color filters constituting one complete color filter set (R, G, B). Thus the direction in which to transfer the signal charges deviates necessarily from the direction in which the image is shifted.

With the first embodiment, each picture element is scanned, while being fed in the vertical direction from the first to the third color filter arrays $1_1$ through $1_3$, by all color filters (R, G, B) constituting one complete color filter set. That is, all color elements of every picture element are detected by the three sensor arrays $1_1$ through $1_3$. This eliminates the possibility of a moire pattern getting generated from scanning.

The first embodiment staggers the color filters between the sensor arrays by obliquely forming the sensors and the shift gates. This construction is conducive to transfer smoothly the signal charges from the shift gates to the sensor arrays and vice versa. Alternatively, only the shift gates 2 may be formed obliquely to provide a color filter stagger between the sensor arrays, as illustrated in FIG. 2. FIG. 2 is a plan view of a color linear image sensing device practiced as the second embodiment of the invention. The second embodiment permits smooth transfer of the signal charges from the sensors to the shift gates 2.

Another alternative is to provide a color filter stagger between sensor arrays by forming the sensors obliquely within the sensor arrays $1_1$ through $1_3$, as practiced in the third embodiment of FIG. 3. This structure facilitates the reading of the signal charges from the shift gates 2 to the sensors.

In the first embodiment of FIG. 1, both the sensors in the sensor arrays $1_1$ through $1_3$ and the shift gates 2 are formed obliquely. The structure is conducive to permitting smooth transfer of the signals charges not only from the shift gates 2 to the sensors but also in the reverse direction. In the first through the third embodiments, the formation of the sensors (picture elements) or of the shift gates may be tilted either to the right or to the left.

In the above embodiments, the number of sensor arrays is 3 (=N). Alternatively, there may be two sensors or more than four sensors furnished. The unit set of color filters in these embodiments is made of R (red), G (green) and B (blue) filters. Alternatively, any other set of color filters will do as long as the color filters making up the unit set results substantially in the color of white when combined.

As described, the color linear image sensing device according to the invention includes a color filter stagger between adjacent sensor arrays so that any one picture element is scanned by all color filters constituting one complete set of color filters. This structure makes it possible to read all color elements of every picture element into the sensing device. Given the complete color information, there is no possibility of moire getting generated. In the other structures according to the invention, the color filters and the shift gates between the sensor arrays are so formed that the signal charges are transferred smoothly between the shift gates and the sensor arrays and/or vice versa.

As many apparently different embodiments of this invention may be made without departing from the spirit and scope thereof, it is to be understood that the invention is not limited to the specific embodiments thereof except as defined in the appended claims.

What is claimed is:

1. A color linear image sensing device for scanning and sensing an image in a vertical scanning direction and generating signal charges corresponding to said image, comprising:

at least two arrays each having a plurality of sets of color sensors disposed in a horizontal scanning direction for sensing said image and generating said signal charges corresponding to said image, each of said sets comprising at least a first color sensor sensing a first color and a second color sensor sensing a second color different from said first color;

a shift gate between each of the first color sensors of the two arrays and a shift gate between each of the second color sensors of the two arrays; and the color sensors and the respective connecting shift gates being aligned obliquely relative to said vertical scanning direction so that in the vertical scanning direction the second color sensors in the second array will lie under and in vertical alignment with the first color sensors in the first array and the first color sensors in the second array will lie under and in vertical alignment with the second color sensors in the first array.

2. A device according to claim 1 wherein a shift register is provided adjacent to one of said arrays for transferring said signal charges.

3. A device according to claim 1 wherein a third array is provided beneath said second array, said third array having a plurality of sets of said color sensors, and wherein each of said sets of color sensors comprises said first color sensor, said second color sensor, and a third color sensor for sensing a third color different than the first and second colors, and wherein shift gates are provided between each of the corresponding color sensors between the first and second arrays and between the second and third arrays, and wherein the color sensors and the shift gates are obliquely arranged so that in the vertical scanning direction the second color sensors in the second array will lie under and in vertical alignment with the first color sensors in the first array, and the third color sensors in the third array will lie under and in vertical alignment with the second color sensors in the second array.

4. A color linear image sensing device for scanning and sensing an image in a vertical scanning direction and generating signal charges corresponding to said image, comprising:

at least two arrays each having a plurality of sets of color sensors disposed in a horizontal scanning direction for sensing said image and generating said signal charges corresponding to said image, each of said sets comprising at least a first color sensor sensing a first color and a second color sensor sensing a second color different from said first color;

a shift gate between each of the first color sensors of the two arrays and a shift gate between each of the second color sensors of the two arrays; and the respective connecting shift gates being aligned obliquely relative to said vertical scanning direction so that in the vertical scanning direction the second color sensors in the second array will lie under and in vertical alignment with the first color sensors in the first array, and the first color sensors in the second array will lie under and in vertical alignment with the second color sensors in the first array.

5. A device according to claim 4 wherein a shift register is provided adjacent to one of said arrays for transferring said signal charges.

6. A device according to claim 4 wherein a third array is provided beneath said second array, said third array having a plurality of sets of said color sensors, and wherein each of said sets of color sensors comprises said first color sensor, said second color sensor, and a third color sensor for sensing a third color different than the first and second colors, and wherein shift gates are provided between each of the corresponding color sensors between the first and second arrays and between the second and third arrays, and wherein the shift gates are obliquely arranged so that the second color sensors in the second array will lie under and in vertical alignment with the first color sensors in the first array, and the third color sensors in the third array will lie under and in vertical alignment with the second color sensors in the second array.

7. A color linear image sensing device for scanning and sensing an image in a vertical scanning direction and generating signal charges corresponding to said image, comprising:

at least two arrays each having a plurality of sets of color sensors disposed in a horizontal scanning direction for sensing said image and generating said signal charges corresponding to said image, each of said sets comprising at least a first color sensor sensing a first color and a second color sensor sensing a second color different from said first color;

a shift gate between each of the first color sensors of the two arrays and a shift gate between each of the second color sensors of the two arrays; and the color sensors being aligned obliquely relative to said vertical scanning direction so that in the vertical scanning direction the second color sensors in the second array will lie under and in vertical alignment with the first color sensors in the first array, and the first color sensors in the second array will lie under and in vertical alignment with the second color sensors in the first array.

8. A device according to claim 7 wherein a shift register is provided adjacent to one of said arrays for transferring said signal charges.

9. A device according to claim 7 wherein a third array is provided beneath said second array, said third array having a plurality of sets of said color sensors, and wherein each of said sets of color sensors comprises said first color sensor, said second color sensor, and a third color sensor for sensing a third color different than the first and second colors, and wherein shift gates are provided between each of the corresponding color sensors between the first and second arrays and between the second and third arrays, and wherein the shift gates are obliquely arranged so that the second color sensors in the second array will lie under and in vertical alignment with the first color sensors in the first array, and the third color sensors in the third array will lie under and in vertical alignment with the second color sensors in the second array.

* * * * *